United States Patent
Huang et al.

(10) Patent No.: US 10,522,341 B2
(45) Date of Patent: Dec. 31, 2019

(54) COMPOSITION AND METHOD FOR REMOVING RESIDUE FROM CHEMICAL-MECHANICAL PLANARIZATION SUBSTRATE

(71) Applicant: Cabot Microelectronics Corporation, Aurora, IL (US)

(72) Inventors: Helin Huang, Aurora, IL (US); Ji Cui, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 93 days.

(21) Appl. No.: 15/825,305

(22) Filed: Nov. 29, 2017

(65) Prior Publication Data

US 2018/0166273 A1 Jun. 14, 2018

Related U.S. Application Data

(60) Provisional application No. 62/434,153, filed on Dec. 14, 2016.

(51) Int. Cl.
| | |
|---|---|
| *C09G 1/06* | (2006.01) |
| *H01L 21/02* | (2006.01) |
| *H01L 21/321* | (2006.01) |
| *C11D 3/22* | (2006.01) |
| *C11D 3/20* | (2006.01) |
| *C11D 17/00* | (2006.01) |
| *C11D 3/48* | (2006.01) |
| *C11D 3/00* | (2006.01) |
| *C11D 11/00* | (2006.01) |
| *C11D 3/43* | (2006.01) |

(52) U.S. Cl.
CPC ...... *H01L 21/02074* (2013.01); *C11D 3/0047* (2013.01); *C11D 3/2075* (2013.01); *C11D 3/222* (2013.01); *C11D 3/43* (2013.01); *C11D 3/48* (2013.01); *C11D 11/0047* (2013.01); *C11D 17/0013* (2013.01); *H01L 21/3212* (2013.01)

(58) Field of Classification Search
CPC ............ C11D 11/047; H01L 21/3212
USPC .................. 510/175; 438/692, 693
See application file for complete search history.

(56) References Cited

U.S. PATENT DOCUMENTS

| | | | | |
|---|---|---|---|---|
| 6,465,403 | B1 * | 10/2002 | Skee | C11D 3/0073 |
| | | | | 134/3 |
| 8,110,534 | B2 | 2/2012 | Kawase et al. | |
| 8,372,304 | B2 | 2/2013 | Yamada et al. | |
| 9,028,709 | B2 | 5/2015 | Tsuchiya et al. | |
| 2009/0311864 | A1 * | 12/2009 | Yamada | C09G 1/02 |
| | | | | 438/693 |
| 2012/0270400 | A1 | 10/2012 | Takegoshi et al. | |
| 2013/0183826 | A1 * | 7/2013 | Tsuchiya | B24B 37/044 |
| | | | | 438/692 |
| 2016/0257856 | A1 | 9/2016 | Reiss et al. | |
| 2017/0014969 | A1 * | 1/2017 | Lam | C09G 1/02 |
| 2017/0183540 | A1 * | 6/2017 | Hains | C09G 1/02 |

FOREIGN PATENT DOCUMENTS

| | | |
|---|---|---|
| JP | 2008210990 A | 9/2008 |
| JP | 2014199688 A | 10/2014 |

OTHER PUBLICATIONS

Korean Intellectual Property Office, International Search Report issued for Patent Application No. PCT/US2017/063586 dated Mar. 6, 2018.

* cited by examiner

*Primary Examiner* — Gregory E Webb
(74) *Attorney, Agent, or Firm* — Thomas Omholt; Erika S. Wilson; Daniel C. Shulte

(57) ABSTRACT

Described is a post-CMP cleaning solution and methods useful to remove residue from a CMP substrate or to prevent formation of residue on a surface of a CMP substrate.

15 Claims, No Drawings

COMPOSITION AND METHOD FOR REMOVING RESIDUE FROM CHEMICAL-MECHANICAL PLANARIZATION SUBSTRATE

FIELD OF THE INVENTION

The invention relates to chemical-mechanical planarization (CMP) techniques and related compositions, especially CMP compositions and methods useful during a CMP process step to prevent the formation of residue on a surface of a CMP substrate, or to remove residue from a CMP substrate.

BACKGROUND

In the field of microelectronic devices, which includes the fields of integrated circuits, optical devices, memory devices, magneto-electric components, and other microdevices or microdevice components used in electronic, memory, optical, and similar applications, a microelectronic device is prepared by multiple steps of depositing and removing combinations of materials onto a substrate. A material of a layer applied during processing may be a conductive material such as a metal, a semiconductor material such as a silicon-based material (e.g., silicon oxide), or a polymeric material. The microelectronic device is prepared by selectively applying and selectively removing these materials at a surface of a substrate in a manner that builds layers of microelectronic structures onto the substrate. Between these steps, many of the applied material layers are processed by steps of planarizing or polishing the uppermost (surface) layer of the substrate. Examples of microelectronic device substrates that require a planar surface during manufacturing include substrates used to produce integrated circuits, memory disks, magnetoelectric microdevices, and the like. Examples of metal and semiconducting materials that are placed onto and removed from a surface of a microelectronic device substrate include tungsten, cobalt, nickel, copper, metal alloys (e.g., $Al_2O_3$, NiC, TiC), oxides such as silicon dioxide, among others. In many instances, a conductive material, e.g., a metal such as tungsten, copper, or cobalt, is placed onto a substrate to cover or fill underlying structures previously prepared at a surface of the substrate. After placement of a layer of conductive material, an excess portion (e.g., "overburden") of that material must be removed to leave behind a remaining amount of the conductive material that forms conductive features of a microelectronic device.

A common technique for processing a surface of a microelectronic device substrate is by chemical-mechanical planarization (CMP). The terms "planarizing" and "polishing," and other forms of these words, although having different connotations, are often used interchangeably, with the intended meaning conveyed by the context in which a term is used. For ease of description, such common usage will be followed herein, and the term "chemical-mechanical planarization" and its abbreviation "CMP" will be used to convey either of the more specific terms of "chemical-mechanical processing" and "chemical-mechanical polishing."

In chemical-mechanical planarization, a substrate is held by a carrier head or "carrier," and a surface of the substrate is pressed against a surface of a CMP pad, typically in the presence of an abrasive material such as an abrasive slurry. The pad is mounted on a platen that opposes the substrate surface, and the substrate surface, held by the carrier, is moved relative to a surface of the pad by placing the carrier and substrate, the platen, or both, in motion. As desired to effectively and efficiently remove material from the substrate, the slurry may contain a combination of chemical materials and abrasive particles so that the motion between the substrate surface and the pad, in the presence of the abrasive particles, chemical materials, or both, causes removal of desired amounts and types of materials from the substrate surface, ideally to produce a planar or polished surface. Typical slurries for removing metal from a substrate surface can include a high amount of a liquid carrier in which chemical materials and abrasive particles are dissolved or dispersed. The abrasive particles can have size and composition features to be useful for removing a specific material from a substrate; example particles may be made of or contain alumina, ceria, silica (various forms), or other metal or metal oxide materials. The chemical materials of the slurry are selected to achieve a desired removal rate and final topography (e.g., smoothness) of the finished substrate surface, and the types and amounts of the chemical materials in a slurry can depend on the type of material or materials present at the substrate surface. Examples of chemical materials include organic chemical materials that function as one or more of a surfactant, oxidizer, organic inhibitor (to control a removal rate), chelating agents, and other chemical materials that contain an organic group. Other possible chemical materials include pH adjusting agents (base, acid), and biocide (as a preservative).

Many CMP processes that remove a conductive metal from a substrate surface use a two step process. A first step is used for aggressive removal of a layer of metal "overburden," and is performed to effect a relatively high removal rate; this step is often referred to as a "bulk removal" step. A subsequent step is performed to refine or "polish" the surface after the bulk removal step, this step often being referred to as a "polish" step. The bulk removal step is performed with a slurry that includes abrasive particles and chemicals selected to produce a high removal rate. High selectivity during a bulk removal step to remove metal relative to other materials (e.g., silicon oxide) may not be required or emphasized. The subsequent polishing step is commonly performed with a slurry that includes different (e.g., less aggressive) abrasive particles and different chemical materials compared to a slurry used in bulk removal step. During a polishing step, more selective removal of one type of material (e.g., a metal) relative to a different material (e.g., silicon oxide) may be important, and a high rate of removal of a material is less important. Also, different processing parameters may be used with the two different types of steps, such as different speeds of relative motion between the substrate and the pad, different pressures between the substrate and the pad, and different processing times. Desirably, and by current conventional practices, the bulk removal step is performed without removing the substrate from the carrier; i.e., the substrate is placed in a carrier for processing by the bulk removal step, and the substrate is held in the same carrier for processing in the polishing step.

The polishing step is generally followed by a "post-CMP" cleaning step, during which the substrate is physically removed from the carrier and transferred to a cleaning apparatus that further cleans the substrate surface by means that may include a brush cleaning station, at which the substrate is mechanically scrubbed and rinsed, also in the presence of a CMP cleaning solution.

With many CMP processes, residues accumulate at a substrate surface and can be present at the substrate surface both during and after a processing step. Significant efforts are made to prevent the formation of residues, or to remove residues once present, because efficient processing of the substrate to a defect-free finished device relies on the existence of a highly refined and clean substrate surface for processing during subsequent deposition and removal steps. Residues materials that contain abrasive particles in particular must be removed because these can produce surface defects such as scratches, as well as device defects in the form of embedded particles.

A variety of possible residue types may be present at a substrate surface following a planarization or polishing step. A residue might include one of the materials that make up a slurry, e.g., a chemical material or an abrasive particle, alone or in combination. A residue might also include a material that becomes introduced to the slurry during a CMP process step, such as a material that becomes removed from a substrate surface during processing (e.g., a metal ion) or that is generated during processing by reaction or chemical modification (e.g., oxidization or reduction) of a chemical material of the slurry. Certain solid, e.g., particle type, residues are formed during a processing step if two such materials combine or interact in a manner that causes the two to produce a solid, for example by precipitating out of solution, by agglomerating, or by coagulating to form a solid residue particle (also referred to as "residue particles," for short). Examples of these types of residue particles can form when an organic chemical material in a slurry interacts with a metal material in a manner by which the two materials form a solid (e.g., agglomerate, coagulate, or precipitate). The metal material may be a metal abrasive particle, a metal-containing abrasive particle (e.g., a metal oxide), a metal ion, or another metal-containing material in the slurry that can combine with the organic chemical material to form a solid residue particle by precipitation, agglomeration, or a coagulation. Many slurries contain organic chemicals that can be attracted (chemically, ionically, etc.) to a metal material.

Solid residue particles are problematic if they are attracted to a surface of a CMP substrate to a degree that the particles will stubbornly adhere to the surface. When such residue particles are present at a CMP substrate surface, an additional processing step may be required to dissolve the residue particles or to physically remove the particles from the surface. Examples of such steps include an added cleaning or rinsing step ("in-situ cleaning") performed at an end of a CMP process step (e.g., a bulk removal step, a polishing step, or the like), without removing the substrate from the carrier used to perform that CMP process step. The cleaning or rinsing step may typically use the same carrier, platen, and pad as the preceding step (or a subsequent CMP step), but involves a cleaning solution that does not contain abrasive particles. The cleaning solution may instead contain only deionized water or deionized water with optional organic solvent, pH adjusting agent (acid or base), surfactant, or chelating agent, to dissolve or rinse away the solid residue particles.

The problem of residue particles formed by a combination of two or more materials present in a slurry, during a CMP process step, can be exacerbated by contamination of materials between earlier and later processing steps in a series, especially if the steps are performed on a substrate that is held in the same carrier for both of the earlier and the later steps. During a series of CMP steps, chemical materials or abrasive particles may remain at a surface of a substrate or at a surface of a substrate carrier, at an end of a first or earlier step. These materials can be carried to a subsequent step on the substrate surface or the carrier. If one or more of the materials from the previous step are not compatible with materials of a slurry of the subsequent step (e.g., can combine with a material that is or becomes present during the subsequent step to coagulate, precipitate, or agglomerate), residue particles are produced during the subsequent step.

Example CMP processing methods that include multiple steps, that are susceptible to contamination of a later step by materials of an earlier step, include multi-step (e.g., two-step) processes for removing metal from a substrate, which include a first bulk removal step followed by a subsequent polishing step on the same substrate. The abrasive particles and the chemical materials of the slurry useful for performing the bulk removal step are designed to provide desired results of a bulk removal step, including a high removal rate for the metal material being removed. The chemistry of the slurry for the subsequent (polishing) step does not require a high removal rate, but is intended to provide a more gentle removal of material and, often, high selectivity in removing one type of material from the substrate versus a different type of material also present at the substrate surface. For efficiency, these multi-step processes are preferably performed using different platens and pads, but with the substrate being held using the same carrier for each step. The carrier will be used to hold the substrate to engage the substrate with a first platen, with use of a first "bulk removal" slurry. The carrier will then transport the substrate to a second platen, which will perform a polishing step using a second (polishing) slurry that has different abrasive particles and chemical materials. The carrier, the substrate, or both, can physically transfer chemical materials, abrasive particles of first slurry, or chemical materials produced during the first step, to the second step, i.e., can contaminate the second step with materials of the first step.

Existing techniques for removing residues from surfaces of CMP substrates during a CMP process, e.g., "in-situ cleaning" techniques, can be effective with certain types of residues on certain substrates. The effectiveness can depend on the type of residue (chemical, particulate, agglomerate, coagulate, precipitate, etc.), its chemical and physical makeup and structure, the type of substrate and degree of attraction between the residue and substrate surface, and whether or not the cleaning solution is effective in breaking down or dissolving the residue particle or disassociating the residue particle from the substrate surface. Existing techniques are not generally or completely effective to remove all types of residue particles, especially residue particles that contain both an organic material and an inorganic material that combine to form a residue particle structure. Significant need continues to exist for new and more highly effective cleaning solutions and in-situ cleaning steps for removing these types of residue particles from CMP substrate surfaces.

SUMMARY

The invention relates to novel and inventive CMP compositions (e.g., post-CMP cleaning solutions or chemical buff solutions) and CMP process steps that involve the use of cyclodextrin compound as an agent in a CMP composition (e.g., post-CMP cleaning solutions or chemical buff solutions) or in a CMP process step in a manner by which the cyclodextrin compound prevents the formation of residue particles during chemical-mechanical processing, or by which the cyclodextrin compound is effective to facilitate removal of residue, especially organic material residue, or residue particles that contain organic material, from a surface of a substrate. Example post-CMP cleaning solutions contain cyclodextrin and can be useful for a cleaning or rinsing step to remove chemical or particulate residue from a surface of a CMP substrate by contacting the CMP substrate with the cleaning solution that contains cyclodextrin compound, with motion and contact with a CMP pad. The cyclodextrin compound can form a complex with organic material residue in the slurry or at a surface of a substrate, optionally but not necessarily with the organic material residue being part of a larger agglomerate, particulate, or coagulate, i.e., residue particles. The methods include "in-situ" cleaning (including rinsing) of the CMP substrate during, after, or between one or more planarization or polishing steps, wherein the cleaning step is performed by holding the CMP substrate in a carrier that is the same carrier that is used in the planarization step, the polishing step, or both.

According to the invention, it has been discovered that cyclodextrin compounds are effective at preventing the formation of such residue particles, or breaking down such residue particles or being otherwise effective to remove organic material residue or particle residue from a substrate surface. A cleaning solution that contains water and cyclodextrin can be dispensed onto a surface of a substrate that has chemical residue, residue particles, or both, present at the substrate surface. Without wishing to be bound by a theory, the cyclodextrin is believed to attract the organic material of the residue or residue particles to its hydrophobic interior, and forming a complex. By forming a complex with the organic material, the cyclodextrin effectively removes, sequesters, or isolates the organic material and prevents it from being present at a surface of the substrate or carrier, or from becoming or remaining part of a residue particle at a surface of the substrate or carrier. The cleaning solution that contains cyclodextrin is, therefore, effective to removing chemical residue or residue particles from a surface of a substrate or a carrier in a cleaning step.

In preferred embodiments a chelating agent can also be included in the cleaning solution to further improve the prevention or removal of residue and the residue particles. Again not wishing to be bound by theory, a chelating agent may be attracted to an inorganic (e.g., metal) portion of a residue particle, allowing the inorganic portion to be dispersed from the structure of a residue particle, allowing the residue particle to be dissolved, broken down, or otherwise removed from a surface of a substrate or a carrier.

In one aspect, the invention relates to a method of removing residue from a CMP substrate. The method includes: (a) providing a CMP substrate in a carrier, (b) providing a platen that includes a pad, (c) providing cleaning solution comprising: liquid carrier, and cyclodextrin compound, and (d) contacting the pad and the cleaning solution to a surface of the substrate, with motion, to remove the residue from the surface.

In another aspect the invention relates to a cleaning solution for processing a CMP substrate. The solution includes: liquid carrier, and from 10 to 50,000 parts per million cyclodextrin compound based on total weight cleaning solution (from 0.0010 to 5 weight percent based on total weight cleaning solution).

DETAILED DESCRIPTION

The invention relates to novel and inventive CMP compositions, post-CMP cleaning solutions (chemical buff solutions), and CMP process steps that involve the use of cyclodextrin compound as an agent that prevents the formation of residue and residue particles during chemical-mechanical processing, or that facilitates the breakdown or removal of residue particles from a surface of a CMP substrate during a CMP rinse or cleaning step. Described compositions contain cyclodextrin compound and other ingredients that allow the cyclodextrin compound to be effective during a process step, including but not limited to a cleaning or rinsing step, to prevent the formation of or to dissolve, break down, or physically or mechanically remove chemical residue (e.g., organic material) or residue particles from a surface of a CMP substrate or a carrier holding the substrate. Preferred CMP compositions can contain the cyclodextrin compound dissolved in liquid carrier, optional chelant, optional biocide, and optional pH adjuster, with a minimum of (e.g., without any) other solid (e.g., abrasive particle) or chemical materials, for example to the substantial or complete exclusion of other materials that are of a type that is used to cause or facilitate the chemical or mechanical removal of material (other than particle residue) from a substrate surface.

During chemical-mechanical processing steps such as a planarization or a polishing step, particles of solid residue may form on a substrate surface from a combination of two different materials present at the substrate surface during the step. Problematic residues can be formed from various solid or dissolved materials that are either found initially in a slurry as the slurry is added to the CMP process step, or that become present during the processing step. Two or more materials, such as an organic material and an inorganic material (e.g., a metal material) may have chemical, physical, or electrostatic properties that cause the materials, when present in the same slurry of a CMP process step, to combine and to form a solid residue particle by precipitating out of solution, by forming an agglomerate or a coagulate, or the like. The shear and energy provided by motion between the substrate surface, the slurry materials, and a CMP pad, can increase the likelihood of these particles being formed. Certain such residue particles are problematic when formed at a surface of a CMP substrate and must be either prevented or removed. Once formed and present at a substrate surface, these residue particles but can be stubbornly attracted to the surface and are difficult to break down or remove.

Examples of difficult-to-remove residue particles include particles that are formed from a combination of metal or metal-containing particles such as a metal abrasive particle or a metal oxide abrasive particle (e.g., alumina abrasive particles), and an organic material. The metal material and the organic material have physical, electrostatic, or chemical properties that, when the two are present in a slurry during a CMP process step, cause the two materials to be attracted to and adhere to each other and form an agglomerated or coagulated residue particle structure that is made up of multiple abrasive particles and a collection of molecules of the organic material. Certain other residue particles that are likewise difficult to remove may be formed by a combination of a metal ion (e.g., dissolved in a slurry) with an organic material that is attracted to the metal ion such that when the organic material and metal ion interact they precipitate out of solution and become a residue particle that is attracted to a surface of a substrate being processed. If residue particles, of any origin, are attracted to a CMP substrate surface with sufficient tenacity, and cannot be dissolved, broken down, or otherwise easily removed using a rinse of mostly water and contact (with motion) between the substrate surface and a CMP pad, the residue particles will collect on the substrate surface and remain on the surface for subsequent processing. To prevent these particles from producing difficulties in those later processing steps, and to allow the substrate to be further processed to a high-quality, low-defect processed device, these residue particles must be removed from the substrate surface.

The organic material capable of forming a residue particle as described may be any organic material that is present in a slurry during a CMP process step and that can become chemically, electrostatically, or physically associated with and combined with a metal material (which may be dissolved, solid, charged, uncharged, etc.) that is also present in the slurry, to form a solid residue particle (e.g., a precipitate, agglomerate, or coagulate). Many types of organic materials are known for use in a slurry for CMP processing. Examples include ingredients that are known and referred to in the CMP arts as surfactants, polymers, organic oxidizers, inhibitors, and stabilizers, or a combination of these ingredients, among others.

According to the invention, organic materials of a residue or residue particle are also of a type that is capable of being attracted to an annular molecule of cyclodextrin compound to form a complex of the cyclodextrin compound and the organic material. Cyclodextrin has an annular structure with an interior space (within the annular structure) that is hydrophobic. Without being bound by theory, it is believed that certain types of organic materials in a slurry or in a particle residue can become associated with the hydrophobic interior of a molecule of cyclodextrin compound in a manner by which the cyclodextrin compound and the organic material can form a complex, these types of organic materials especially including molecules that have a hydrophobic group (i.e., a hydrophobic chemical moiety) that can be stearically attracted to and then held at the annular interior portion of the cyclodextrin compound. Accordingly, types of organic material residues that the presently-described methods may be particularly useful in removing from a surface of a substrate or carrier include types that form a complex with cyclodextrin compound due to a molecular structure that can become located and held within the hydrophobic interior of a cyclodextrin compound, such as an organic material that includes a hydrophobic group. Similarly, residue particles that may be prevented from forming during a CMP step, or that may be dissolved, broken apart, or removed from a substrate surface or a carrier surface by a CMP cleaning step using a CMP solution that contains cyclodextrin compound, include those particles that can be formed from one or more organic materials that have or include a molecular structure that can become located and held within the hydrophobic interior of a cyclodextrin compound, such as an organic material that includes a hydrophobic group.

A hydrophobic group of an organic material can have a chemical structure that allows the group to become located within the open, hydrophobic interior space of a cyclodextrin molecule to form a "complex" with the cyclodextrin molecule. To form this type of complex, the hydrophobic group may preferably be relatively straight or not highly branched so that the hydrophobic group is stearically and thermodynamically capable of becoming located at the hydrophobic interior of the annular cyclodextrin compound. When positioned at the interior space of a cyclodextrin molecule, the hydrophobic group is believed to be associated with the hydrophobic interior without a covalent or ionic chemical bond between the organic material molecule and the cyclodextrin compound molecule. Example hydrophobic groups include straight and branched alkyl groups that may contain small amounts of branching, optional unsaturation, and optional heteroatoms such as a charged nitrogen or phosphorus atom.

Example metal materials that may combine with organic material to form a residue particle include metal or metal-containing (e.g., metal oxide) abrasive particles such as alumina abrasive particles and other metal, metal oxide, or metal-containing particles known to be useful in a CMP process step such as a planarization step or a polishing step. Metal-containing abrasive particles include from: alumina, zirconia, rare earth metal oxide (such as yttrium oxide or yttria). Other examples include metal ions that are not initially present in a CMP slurry as introduced (e.g., dispensed) to a CMP process step, but are generated during a CMP process step is performed to remove an amount of metal material from a substrate surface. Examples of these include metal ions (cations or anions) such as a copper, tungsten, silver, nickel, or cobalt, ion that is removed from a substrate surface that includes that metal and becomes dissolved as an ion in the slurry.

The organic material and the inorganic material may be uncharged or charged, e.g., may exhibit opposite chemical charges. In particular CMP process steps and related methods of the invention as described, example residue particles are in the form of agglomerates that contain metal-containing abrasive particles (e.g., alumina oxide), which may be positively or negatively charged, and which are attracted to an organic material that is of an opposite charge. Many surfactants are positively or negatively charged. Example residue particles may include a metal-containing abrasive particle having a positive charge, attracted to and agglomerated with an organic material (e.g., surfactant) having a negative charge. Alternate residue particles may include a metal-containing abrasive particle having a negative charge, attracted to and agglomerated with an organic material (e.g., surfactant) having a positive charge.

According to the invention, it has been discovered that cyclodextrin compounds can be used to effectively prevent the formation of residue particles as described, or to break these particles apart or remove these particles from a surface of a CMP substrate during processing. Alternately, the cyclodextrin compound may complex with the organic material as the organic material is dissolved in the slurry and prevent formation of a residue particle. Accordingly, example post-CMP cleaning solutions, or "chemical buff solutions" or "CMP solutions" or "cleaning solutions", are liquid solutions that contain liquid carrier, cyclodextrin, and one or more optional chemical materials such as a pH-adjuster, organic solvent, biocide, and chelating agent.

According to specific examples of the use of cyclodextrin compound for this purpose, a post-CMP cleaning solution that contains liquid carrier (e.g., water) and cyclodextrin compound (with one or more other optional ingredients such as chelant, pH adjuster, or biocide, and in the absence of substantial absence of abrasive particles and various other types of chemical materials useful in CMP steps) can be dispensed onto a surface of a substrate that has residue (e.g., organic material), residue particles, or both, present at the substrate surface, and optionally present at a surface of a carrier of the substrate as well. Mechanical motion between the substrate surface and a pad (e.g., a CMP pad such as a polishing pad) can facilitate removal of the residue or residue particles in the presence of the cleaning solution. Without wishing to be bound by theory, the cyclodextrin compound is believed to attract the organic material residue, or to organic material that is part of a residue particles. The organic material is drawn to the hydrophobic interior of the cyclodextrin compound to form a complex, thus allowing: removal of the organic material from the surface of the substrate or carrier; removal of the organic material from a residue particle to cause disruption, dissolution, or breakdown of the structure of the residue particle; or any other means of causing a reduction in the amount of organic material residue, residue particles, or both, from a surface of a substrate or carrier of the substrate.

Example post-CMP cleaning solutions are useful for removing residue particles or particulates that reside at a substrate surface (or carrier) in a step that does not substantially remove material that makes up the surface layer, i.e., that is part of the surface layer, by way of a CMP process, i.e., does not cause abrasive or chemical removal of material from the layer of material that makes up the surface of the substrate, as would a CMP polishing, bulk removal, or planarization step. Consequently, described cleaning solutions do not require and can preferably exclude any substantial amount of chemical material or abrasive material that is useful in other types of CMP slurries that are adapted for material removal by a CMP process, such as those types of slurries typically referred to as bulk removal slurries, polishing slurries, and the like, which contain abrasive particles and chemical materials adapted to mechanically (by abrasion) or chemically remove material that makes up the substrate surface (as opposed to residue that resides on the surface), examples of these materials including metals (e.g., copper, cobalt, silver, tungsten, or another metal, from a substrate surface), or silicon-based materials such as silicon oxide, which are typically mechanically or chemically removed from the substrate surface during a bulk removal, planarization, or polishing step.

In specific, the cleaning solutions as described can exclude abrasive particles such as silica particles, ceria particles, zirconia particles, alumina particles, and any other metal and metal oxide abrasive particles, etc., that exist in solid (non-dissolved) form in a slurry and thereby function to mechanically abrade and remove material from a surface of a substrate during a CMP process step such as a planarization or polishing step. Preferred cleaning solutions of the present description, e.g., post-CMP cleaning solutions, contain not more than 0.1, 0.01, or 0.001 weight percent of solid abrasive particles based on total weight cleaning solution. These amounts of abrasive particles for a CMP composition of the invention, e.g., a cleaning solution, are representative for compositions at a point of use and for CMP concentrate compositions that are sold in a concentrated form to be diluted for use in CMP processing.

Similarly, preferred cleaning solutions as described do not require and can optionally exclude chemical materials that function by chemical interaction with a material that makes up a surface layer of a CMP substrate, or with another material of a slurry, to facilitate effective removal of the surface layer material from a substrate surface, such as by increasing a removal rate or improving selectivity of one material that makes up the substrate surface relative to another material that makes up the substrate surface. Examples of such chemical materials include surfactant (including to function as a removal rate inhibitor), catalyst (including a catalyst stabilizer), oxidizer, among others. Example cleaning solutions may contain not more than 1, 0.1, 0.01, or 0.001 weight percent of any one or combination of surfactant, inhibitor, catalyst, or oxidizer, based on total weight CMP solution. These concentrations are meant for at a point of use; higher concentrations of the abrasive particles will be present in a concentrated composition, that is diluted prior to use.

For purposes of excluding metal ion accelerators, oxidizers, and surfactants as ingredients from a post-CMP cleaning solution as described, these terms are used in a manner that is consistent with their meanings in the CMP arts, and as follows. A "surfactant" is an organic compound that lowers the surface tension (or interfacial tension) between two liquids or between a liquid and a solid, typically an organic amphiphilic compound that contains a hydrophobic group (e.g., a hydrocarbon (e.g., alkyl) "tail") and a hydrophilic group. A surfactant may be of any HLB (hydrophilic-lipophilic balance) value, and may be charged, uncharged, etc., examples of many varieties of surfactants being well known in the chemical and CMP arts.

Exemplary oxidizers (a.k.a., oxidizing agents) include inorganic and organic per-compounds. A per-compound as defined by Hawley's Condensed Chemical Dictionary is a compound containing at least one peroxy group (—O—O—) or a compound containing an element in its highest oxidation state. Examples of compounds containing at least one peroxy group include hydrogen peroxide and its adducts such as urea hydrogen peroxide and percarbonates, organic peroxides such as benzoyl peroxide, peracetic acid, and di-t-butyl peroxide, monopersulfates ($SO_5^=$), dipersulfates ($SO_2O_8^=$), and sodium peroxide. Examples of compounds that contain an element in its highest oxidation state include periodic acid, periodate salts, perbromic acid, perbromate salts, perchloric acid, perchlorate salts, perboric acid, and perborate salts and permanganates. An often-preferred oxidizing agent for CMP slurries is hydrogen peroxide.

Some example post-CMP cleaning solutions can contain liquid carrier and cyclodextrin compound, with not more than an insubstantial amount of any other material. Such compositions may consist of or consist essentially of water (preferably deionized water) and cyclodextrin compound. A composition that consists essentially of water (preferably deionized water) and cyclodextrin compound is one that contains the water, the cyclodextrin compound, and not more than 0.5, 0.1, 0.01, or 0.001 weight percent of any other materials based on total weight CMP composition.

Optionally, these and other example post-CMP cleaning solutions as described can contain the water, the cyclodextrin compound, and one or more of a chelant, a pH adjuster, and a biocide, along with not more than an insubstantial amount of other materials, meaning that the cleaning solution will consist of or consist essentially of water (preferably deionized water), cyclodextrin compound, and one or more of chelant, pH adjuster, and biocide. A composition that consists essentially of water (preferably deionized water), cyclodextrin, and one or more of chelant, pH adjuster, and biocide, is one that contains the water, cyclodextrin compound, and the one or more chelant, pH adjuster, and biocide, with not more than 0.05, 0.1, 0.01, or 0.001 weight percent of any other materials based on total weight of the CMP composition.

The post-CMP cleaning solution comprises a cyclodextrin compound, which includes cyclodextrin compounds that are non-derivatized as well compounds that are derivatized. Cyclodextrin compounds are a family of well-known compounds that are made of multiple sugar molecules and formed into a three-dimensional tubular or annular ring structure, and are sometimes referred to as cyclic oligosaccharides. Cyclodextrins are composed of α-D-glucopyranoside molecular units connected by a 1-4 linkage (see structure below) between the units. Forms of cyclodextrin that are useful in a CMP composition as described include alpha cyclodextrin, which is a 6-membered ring; β (beta)-cyclodextrin, which is a 7-membered ring, and γ (gamma)-cyclodextrin, which is an 8-membered ring:

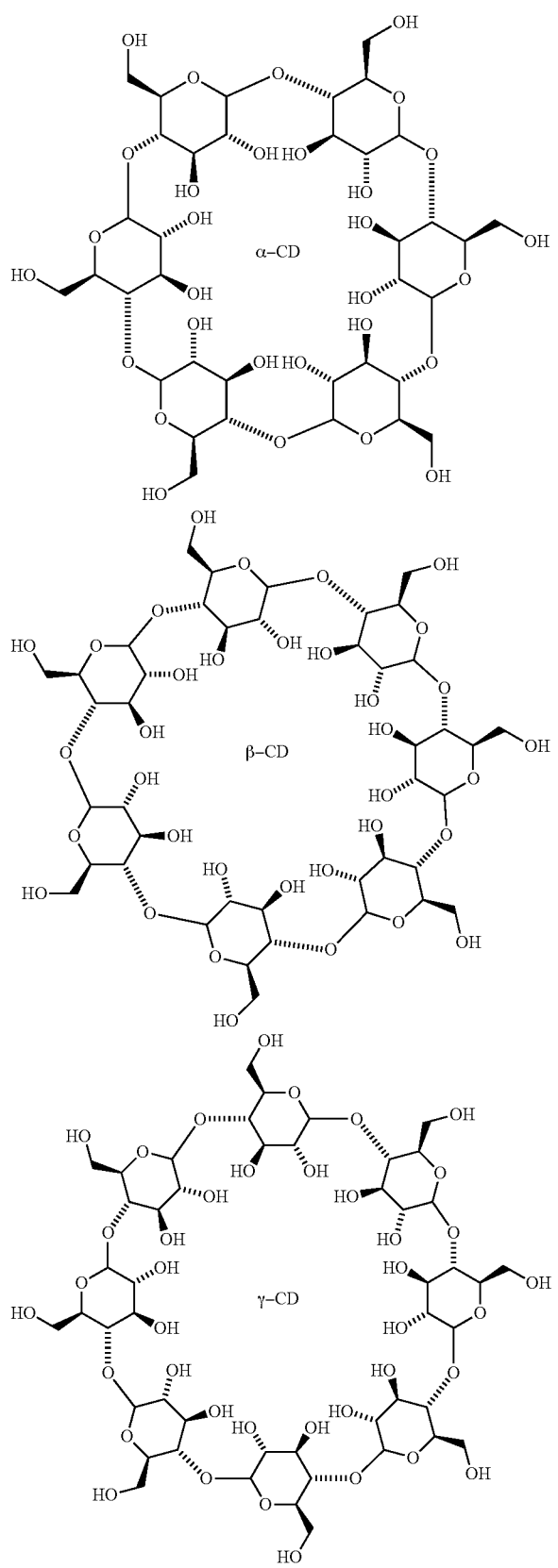

According to the invention, it has been found that cyclodextrin present in a post-CMP cleaning solution can be effective to remove organic residues from a substrate (or substrate carrier), to prevent the formation of residue particles at a substrate surface, or to break down or dissolve residue particles present at a surface of a CMP substrate or substrate carrier. Without being bound by theory, a cyclodextrin compound is believed to attract and contain an organic material at its annular interior space, especially an organic material that includes a hydrophobic moiety having a structure capable of being contained at the interior space of the annular cyclodextrin compound molecule. The cyclodextrin compound can form a complex with the organic material so that the cyclodextrin compound effectively sequesters the organic material and prevents the organic material from becoming disposed at a surface of a substrate or a substrate carrier as residue, or from becoming part of or remaining part of a residue particle at a surface of a substrate or a carrier. When the cyclodextrin compound is present in a cleaning solution, in a step of cleaning a substrate surface that contains residue at the surface, the cyclodextrin compound is effective to remove the organic material from the surface, or to interact with organic material of residue particles to dissolve or otherwise break down the residue particle.

The amount of cyclodextrin compound in a post-CMP cleaning solution as described may depend in great part on the solubility of the cyclodextrin in the liquid carrier, meaning that higher concentrations are generally desired but that concentration levels are typically limited by solubility limits of cyclodextrin compounds in a liquid carrier. Certain derivatized versions of cyclodextrin compounds may exhibit higher solubility's in a liquid carrier relative to non-derivitized cyclodextrin, and as such, derivatized cyclodextrin compounds that exhibit increased levels of solubility can be preferred in a cleaning solution. In general, cyclodextrin compound can be present in a cleaning solution in an amount that is effective when used in a cleaning step: to remove organic material residue from a surface of a substrate or a substrate carrier; to prevent or cause a reduction in residue particle formation in a slurry during a CMP process step; or to remove residue particles that have formed and become attracted to a surface of a CMP substrate (and carrier). In certain useful embodiments, cyclodextrin can be present in the slurry in an amount in a range from about 10 to about 50,000 parts per million cyclodextrin, e.g., about 0.01 to about 5 weight percent, about 0.02 to about 1.5 weight percent, based on the total weight of the cleaning solution. These amounts are for point of use, and will be higher for concentrated compositions.

It is noted that concentrations may be stated on a parts-per-million (ppm) basis, and that the ppm is intended to be a weight basis ratio. For example, 0.01 weight percent is the equivalent of 100 ppm. Concentration of the components of the example cleaning solutions may be stated as a weight percent or as ppm.

A cleaning solution as described can optionally and preferably contain chelant (chelating agent), which can function to associate (e.g., ionically) with an inorganic material, e.g., a metal material of a slurry or of a residue particle. The chelant may become associated with the metal material, e.g., sequestering the metal material, or otherwise preventing the metal material from forming a residue particle in a slurry or at a surface of a CMP substrate during a CMP process. Alternately, or in addition, a chelant may facilitate breakdown or removal of a residue particle by interacting with metal material of the residue particle, and interfering with the interaction of the metal material with an organic material of the residue particle.

The chemical structure and nature (including the charge) of a chelant that will be useful in a particular cleaning solution, for cleaning a particular substrate, can depend on various factors, especially the types of inorganic materials that are present during the cleaning step. The types of these inorganic materials will depend on the nature of previous steps of processing the substrate, including the types of inorganic materials that have been removed from the substrate surface, and the type of inorganic materials, e.g., abrasive particles, that have been used to remove those inorganic materials. Preferred chelants may be capable of becoming electrostatically associated with a surface of an abrasive particle, e.g., an alumina particle, to allow or cause the particle to become dis-agglomerated from organic material of a residue particle. The chelant, by associating with the abrasive particle can allow the abrasive particle to be stable in the solution, separate from the agglomerated residue particle, and, therefore, to become separated from a residue particle when contacted with the chelant. In an example cleaning solution as described, when applied to a substrate having residue particles that contain abrasive particles held together by organic material, the chelant may be electrostatically attracted to surfaces of abrasive particles that make up the residue particles. Based on this attraction, chelant becomes associated with surfaces of the abrasive particles that are part of the residue particles, with a result of breaking up the residue particles or otherwise allowing the abrasive particles to be removed from a surface of a CMP substrate or carrier at which the particles are present.

The chelant may be any chemical compound that is capable of performing as a chelant as described. The chelant may be monodentate, multi-dentate, and of any chemical structure. Certain examples of known chelants include acid-containing organic molecules, especially carboxylic acid-containing organic molecules such as linear or branched C1-C6 carboxylic acid compounds that include phthalic acid, succinic acid, citric acid, tartaric acid, malic acid, gluconic acid, aspartic acid, or a combination thereof, as well as, glycine, amino acids and the like.

Other examples include carboxylic acid group-containing polymers derived from monomers that may include one or more of acrylic acid, methacrylic acid, maleic acid, succinic acid, aspartic acid, 2-acrylamido-2-methyl-1-propanesulfonic, acrylamide, phosphonate methacrylamidopropyl trimethylammonium chloride, allyl halide, or a combination thereof. The polymer may be of any useful molecular weight, e.g., from 120 to 10,000 dalton.

The amount of chelant in a CMP solution as described may depend on factors such as the chemical nature of the chelant, and the types and amounts of other materials in the slurry, including the types and amount of residue (e.g., residue particles) in the slurry or at a surface of a substrate (or its carrier) that is being processed, or, more generally, the types and amounts of materials that will become associated with the chelant. In general, chelant can be present in a CMP composition in an amount effective to cause a reduction in particle residue present at a surface of a substrate (or carrier) during a cleaning step, e.g., to facilitate removal of residue particles that are present at a surface of a CMP substrate (or carrier) upon use of the CMP composition to clean the substrate surface in a cleaning step. In certain useful embodiments, chelant can be present in the slurry in an amount in a range from about 0.01 to about 5 weight percent chelant based on the total weight of the composition, e.g., from about 0.02 to about 1.5 weight percent. These amounts are for point of use CMP compositions, and will be higher for CMP concentrate compositions.

A biocide may also be included in a CMP composition as described herein to prolong the shelf life of the composition, e.g., a CMP concentrate solution. Examples of useful biocides are well known, including hydrogen peroxide, Isothiazolone, glutaraldehyce, among others, and may be included in a CMP solution as described, e.g., a concentrate solution, in any effective amount, such as in a range of from 10-1000 ppm based on the weight of the CMP solution.

The CMP composition, in concentrate form or during use in a CMP process step, can have any pH, e.g., acidic, neutral, or basic. The composition may include substantially any suitable pH adjusting agent or buffering system. For example, suitable pH adjusting agents include organic and inorganic acids effective to reduce pH, such as nitric acid, sulfuric acid, phosphoric acid, phthalic acid, citric acid, adipic acid, oxalic acid, malonic acid, maleic acid, among others. Alternately, to increase pH, a base may be included, such as, KOH, NaOH, $NH_4OH$, tetramethylammonium hydroxide, or an organic base such as ethanolamine and diethanolamine, etc.

Even though oxidizer is non-essential for the present invention to work, the cleaning solution may contain 100-50,000 ppm, on a weight basis, of oxidizing chemicals such as hydrogen peroxide.

Additionally, certain example cleaning solutions do not require and may contain substantially no metal-containing catalyst, meaning, for example, that the cleaning solution contains less than 0.01 weight percent metal-containing catalyst, e.g., less than 0.005 weight percent metal-ion accelerator, based on total weight cleaning solution.

Also, certain example cleaning solutions do not require and may contain substantially no surfactant, meaning, for example, that the cleaning solution contains less than 1, 0.5, or 0.01 weight percent surfactant, based on total weight cleaning solution.

According to various examples of methods for using a CMP solution as described, which contains cyclodextrin compound, such a CMP solution can be useful in a CMP cleaning step to remove residue, e.g., organic material residue, residue particles, or both, from a CMP substrate surface (and optionally from its carrier) during a cleaning step.

The CMP substrate may be a microelectronic device substrate, generally a flat wafer that includes a base and multiple layers of materials that have been selectively deposited onto and selectively removed from the substrate to produce layers of microelectronic features, including a surface layer. The surface layer may be made of such deposited materials, including one or more metal (e.g., copper, tungsten, silver, cobalt, nickel, etc.), insulating material, and semiconducting material. At the surface, but not part of a deposited material that makes up the surface layer of the substrate, residue as described may be present, including organic material residue, residue particles, or both.

According to a cleaning step, a CMP substrate having residue at a surface is contacted with a pad, such as a CMP polishing pad, and a CMP cleaning solution is dispensed onto the polishing pad, the substrate surface, or both. Relative motion between the pad and the substrate surface, with a desired amount of pressure, is provided. No abrasive particles are dispensed onto the surface during the cleaning step either as part of the cleaning solution or by way of any other source, and the only CMP solution that is required to be dispensed to the pad or to the substrate surface is the CMP cleaning solution. The cleaning step, using the CMP solution that contains cyclodextrin compound and optional chelant, etc., is effective to reduce the amount of residues (organic material residue, residue particles, or both) present at the substrate surface and also, optionally and preferably, at surfaces of a carrier that holds the substrate during the cleaning step and that may have been used to hold the substrate during one or more previous CMP process steps. That is, as a result of the cleaning step, the amount of residue, e.g., the number of residue particles, at a substrate surface is reduced relative to the amount present on the surface prior to the cleaning step.

By various examples of useful methods, the CMP substrate can be a substrate that is being processed by a multi-step CMP processing method that includes at least two steps, optionally more than two steps, with the steps including what is referred to as a first (previous or earlier) step and a second (subsequent or later) step. According to certain specific examples of useful methods, the CMP substrate can be a substrate that is being processed by a multi-step CMP processing method that includes at least two steps, optionally more than two steps, with the steps including what are referred to as first (previous or earlier) step performed at a first platen with the substrate being held by a carrier, and a second (subsequent or later) step performed at a different (i.e., second) platen with the substrate still being held by the same carrier. Moving the substrate from the first (earlier) platen to the second (subsequent) platen while the substrate remains held by the same carrier introduces the potential for contamination of the subsequent step by materials of the earlier step, because materials of the first step will remain on the surface of the CMP substrate or at a surface of the carrier when the carrier and substrate are moved together to a different (subsequent, e.g., second) platen. If the materials carried from the earlier CMP process step are not compatible with one or more materials that are present at the subsequent CMP process step, i.e., if materials carried from the earlier CMP process step are capable of combining with a material that is present at the subsequent CMP process step in a manner to form a residue particle, then contamination of the subsequent step with materials from the earlier step will allow for the formation of such residue particles at a surface of the CMP substrate during the subsequent step.

An example of an early step of such a multi-step process is a bulk removal (or "planarization") step for removing metal from a surface layer of a CMP substrate at a relatively high removal rate. A slurry for a bulk removal step may include abrasive particles and chemicals that are designed to produce the relatively high removal rate of metal from the surface layer. Example bulk slurries may contain alumina particles and surfactant (which includes a hydrophobic moiety) along with catalyst, oxidizer, and other optional chemical materials. An example of a subsequent step, after the bulk removal step, is a polishing step, which will require a slurry having a different composition (i.e., a "polishing slurry"). A polishing slurry can include abrasive particles and chemical materials that are designed to have a more gentle effect on the surface of the substrate, to polish the substrate surface to have desired topography with a low level of defects, and without the need for high removal rate of the metal from the surface layer. A polishing slurry may preferably contain softer abrasive particles, if any, as opposed to the relatively harder alumina particles used in a bulk removal step. A polishing slurry may contain, for example, silica particles in the substantial absence of alumina particles.

Particular embodiments of a series of steps that includes a rinse step as describe, may include at least two platens, e.g., three platens (P1, P2, and P3), followed by post-CMP cleaning step; a single carrier holds the substrate during processing at the first platen, then at the second platen, then at the optional third platen. During a first step, at a first platen, a CMP substrate is held by a carrier and contacted with a CMP pad associated with the first platen. Motion and pressure are applied between the pad and the substrate surface to remove material from the substrate surface, e.g., to remove metal (e.g., a continuous tungsten layer) material from a surface layer of the substrate. The first step may be what is referred to as a "bulk removal step," which involves dispensing onto the substrate surface (or the CMP pad) a first slurry (e.g., a bulk removal slurry for removal of metal material) to facilitate removal of the metal material from the surface layer. Example bulk removal slurries may contain one or more of abrasive particles such as alumina particles, surfactant (which includes a hydrophobic group), oxidizer (e.g., organic oxidizer or hydrogen peroxide), metal-containing catalyst (e.g., iron-containing catalyst, with optional organic stabilizer), or other chemical or abrasive materials typically used in a bulk removal step. Example bulk removal steps may be performed on a substrate to remove a portion of a surface layer of tungsten, cobalt, nickel, or another metal previously deposited onto the substrate.

The second step, performed at the second platen, may include a different (e.g., second) CMP pad relative to the first step and a different slurry. Incompatibility between materials of the first slurry (if carried to the second platen) and the second slurry may cause residue particles to form during the second (or a subsequent) step. Typically, the second step may be designed to be less aggressive with respect to the amount of material being removed from the surface layer of the substrate. The second step may involve a slurry that contains abrasive particles, but some or all of the abrasive particles may be different (e.g., softer or of a different average particle size) from abrasive particles used in the first step. In a series of steps for processing a tungsten-containing surface, a bulk removal step may include a slurry that contains alumina particles, for example, and a second (e.g., polishing) step may use a slurry that contains silica particles along with a reduced amount of alumina particles or no alumina particles. The slurry of the second step may contain, for example, less than 1, 0.5, 0.1, 0.05 or 0.001 weight percent alumina particles based on the total weight of abrasive particles in the second slurry. The second step may be performed using the same or different processing parameters compared to the first step, including the speed of rotation of a platen or substrate in a carrier, the pressure between the carrier and the pad, and the amount of time for performing the step, i.e., the amount of time during which the substrate is contacted with the pad with motion and pressure. Alternately, and as may be typical for processing certain types of metal-containing substrates (e.g., a tungsten-containing substrate surface), a second step may be performed using one or more of: slower speeds of rotation of the platen or substrate, a reduced amount of pressure between the substrate and the pad, and a reduced amount of time of contact between the pad and the substrate.

As one embodiment of a cleaning step of the invention, after a CMP processing step such as a polish step at a second platen, a rinse step may be performed to rinse the substrate surface and remove residue. If residue such as organic material residue, residue particles, or both, are present after the polishing step, the rinse step can be useful to remove that residue from the substrate surface. The rinse step can be performed at the second platen, with the substrate being held in the same carrier that was used to perform the polishing step at the second platen.

In specific, a second (polishing) step can be performed at the second platen by dispensing polishing slurry to the pad or the substrate surface, and the substrate surface is polished with motion and pressure between the substrate and the pad. At an endpoint of the polishing step, dispensing of the slurry with abrasive particles has ended. A cleaning step using the post-CMP cleaning solution can then be performed at the same platen, using the same pad, and without removing the substrate from the carrier. For this cleaning step, a post-CMP cleaning solution that contains cyclodextrin compound and as otherwise described herein is dispensed to the pad or substrate surface. The substrate is contacted with the pad, with pressure and motion between the opposed pad and substrate surfaces, and with the CMP cleaning solution being present on the pad and substrate surface. With the motion, pressure, and CMP cleaning solution, residue at the substrate surface can be removed. Organic material residue can be form a complex with the cyclodextrin compound and be removed. Additionally or alternately, residue particles at the substrate surface can be dissolved, broken down, or removed from the substrate surface as described herein by action of the cyclodextrin and optional chelant.

Optionally, a third CMP process step may be performed at a third platen, after the second step. The third step can be similar or identical to the second step and may include a slurry, pad, and process parameters that are similar to or identical to those of the second step. In other embodiments, the slurry of the third step may include one or more materials that are incompatible with one or more materials of the first or second slurry, which could result in the formation of residue particles during the third step. The cleaning step performed after the second step, e.g., at the second platen, can be effective to remove residue in the form of a metal material or organic material present at the carrier or substrate surface at the end of the second step. If the metal material or organic material were not removed, and is incompatible with a material of the slurry of the third step, residue particles would potentially form during the third step. The cleaning step performed after the second step removes the incompatible material or materials from the carrier or substrate surface and prevents the formation of residue particles during the third step.

After a series of CMP process steps, e.g., following the series of steps at platens 1, 2, and 3, or another series, the substrate can be processed as desired. By many processing methods, an immediate next step after a polish step or a rinse step can be cleaning in a post-CMP cleaning step. Such steps are known in the CMP processing arts, and include removing a substrate from a carrier used to hold the substrate during the CMP processing steps and, optionally using another type of holder or carrier, placing the substrate in a post-CMP cleaning apparatus. Many varieties, models, ad sources of post-CMP cleaning apparatuses are well known and available commercially. These apparatuses use liquids, brushes, elevated temperature, or combinations of these, to remove residue from substrate surfaces, sometimes with assistance of sonication. Often the liquid is an aqueous solution that may include an acid (HF), a base ($NH_4OH^+$), surfactant, oxidizer, or other chemical reagents. Additionally, or alternately, the method may also include using a CMP cleaning solution as described herein, including cyclodextrin compound, with the post-CMP cleaning apparatus, for cleaning the substrate in a post-CMP cleaning step.

The invention claimed is:

1. A method of removing residue from a CMP substrate, the method comprising:
   (a) providing a CMP substrate, wherein the substrate comprises a surface layer comprising tungsten, copper, or cobalt,
   (b) providing a platen that includes a pad,
   (c) providing a cleaning solution comprising:
      liquid carrier, wherein the cleaning solution contains substantially no abrasive particles, and
      cyclodextrin compound, and
   (d) contacting the pad and the cleaning solution to a surface of the substrate, with motion, to remove the residue from the surface.

2. The method of claim 1 wherein the cleaning solution comprises from 10 to 50,000 parts per million cyclodextrin compound based on total weight cleaning solution.

3. The method of claim 1 wherein the cleaning solution consists essentially of water and cyclodextrin compound.

4. The method of claim 1 wherein the cleaning solution consists essentially of water, cyclodextrin compound, and one or more chelant, pH adjuster, and biocide.

5. The method of claim 1 wherein the cleaning solution further contains a chelant.

6. The method of claim 1 wherein the surface comprises residue selected from: organic material, and residue particles comprising a precipitated, agglomerated, or coagulated combination of organic material and inorganic material.

7. The method of claim 1 wherein the residue comprises residue particles comprising organic material and metal-containing abrasive particles.

8. The method of claim 7 wherein the abrasive particles are alumina particles.

9. A cleaning solution for processing a post-CMP substrate, the solution comprising:
   liquid carrier, and
   from 10 to 50,000 parts per million based on total weight cleaning solution of a cyclodextrin compound, wherein the cleaning solution contains substantially no abrasive particles.

10. The cleaning solution of claim 9 consisting essentially of water and cyclodextrin compound.

11. The cleaning solution of claim 9 further comprising a chelant.

12. The cleaning solution of claim 11 wherein the chelant is a carboxylic acid group-containing chelant.

13. The cleaning solution of claim 11 wherein the chelant is a compound selected from malonic acid, maleic acid, a linear or branched C1-C6 carboxylic acid compound, phthalic acid, succinic acid, citric acid, tartaric acid, malic acid, gluconic acid, or a combination thereof.

14. The cleaning solution of claim 11 wherein the chelant is a carboxylic acid group-containing polymer.

15. A cleaning solution of claim 9, wherein the solution contains substantially no surfactant.

* * * * *